United States Patent
Yamamoto

(12) 
(10) Patent No.: US 6,284,568 B1
(45) Date of Patent: Sep. 4, 2001

(54) METHOD AND SYSTEM FOR PRODUCING SEMICONDUCTOR DEVICE

(75) Inventor: Tetsuya Yamamoto, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/365,230

(22) Filed: Jul. 30, 1999

(30) Foreign Application Priority Data

Jul. 31, 1998 (JP) .................................. 10-229467

(51) Int. Cl.$^7$ .................................................. H01L 21/44

(52) U.S. Cl. ................... 438/108; 438/612; 438/616; 438/613; 438/120

(58) Field of Search .................... 438/108, 120, 438/613, 343, 616, 612, 618, 209; 29/840, 841, 740; 228/180, 246, 41, 105

(56) References Cited

U.S. PATENT DOCUMENTS

| | | | | |
|---|---|---|---|---|
| 5,498,576 | * | 3/1996 | Hotchkiss et al. | 437/209 |
| 5,620,927 | * | 4/1997 | Lee | 29/841 |
| 5,692,292 | * | 12/1997 | Asai et al. | 29/740 |
| 5,749,510 | * | 5/1998 | Eifuku | 228/122 |
| 5,911,001 | * | 6/1999 | Kawada | 382/141 |
| 5,918,648 | * | 6/1999 | Carr et al. | 141/198 |
| 5,918,792 | * | 7/1999 | Stumpe et al. | 228/41 |
| 5,985,694 | * | 11/1999 | Cho | 438/108 |
| 6,015,722 | * | 1/2000 | Banks et al. | 438/108 |
| 6,056,190 | * | 5/2000 | Foulke et al. | 228/246 |
| 6,071,801 | * | 6/2000 | Wachtler et al. | 438/612 |
| 6,100,175 | * | 8/2000 | Wood et al. | 438/616 |

FOREIGN PATENT DOCUMENTS 10-284499 * 10/1998 (JP) .

* cited by examiner

Primary Examiner—Chandra Chaudhari
Assistant Examiner—Laura Schillinger
(74) Attorney, Agent, or Firm—Finnegan, Henderson, Farabow, Garrett & Dunner, L.L.P.

(57) ABSTRACT

A method for producing a semiconductor device, comprises the steps of: introducing a plurality of semiconductor element supporting substrates or semiconductor elements into a conductive-ball attaching system for collectively attaching conductive balls onto the supporting substrates or semiconductor elements; detecting the position of a defective substrate or defective semiconductor element of the introduced semiconductor element supporting substrates or semiconductor elements, or an undesired position, at which it is not necessary to load the conductive balls; vacuum holding a plurality of conductive balls, which are stored in the conductive-ball attaching system, by conductive-ball holding means; and selectively attaching the plurality of conductive balls, which are vacuum-held by the conductive-ball holding means, onto a desired supporting substrate or semiconductor element of the supporting substrates or semiconductor elements introduced into the conductive-ball attaching system, wherein the conductive-ball holding means selectively vacuum holds the conductive balls so that just enough conductive balls are attached onto the peripheral portion of a wafer, on which semiconductor elements are irregularly arranged, and so that the conductive balls are not attached onto the defective supporting substrate or defective semiconductor element. Thus, it is possible to provide a method for producing a semiconductor device, which is able to load conductive balls onto BGA substrates or semiconductor elements capable of selectively holding the conductive balls so that just enough conductive balls are attached onto the peripheral portion of a wafer, on which the semiconductor elements are irregularly arranged, and so that the conductive balls are not attached onto defective BGA substrates or semiconductor elements.

15 Claims, 12 Drawing Sheets

METHOD AND SYSTEM FOR PRODUCING SEMICONDUCTOR DEVICE

BACKGROUND OF THE INVENTION

1. Field of the Invention

The present invention relates generally to a method and system for producing a flip chip type semiconductor device. More specifically, the invention relates to a method and system for attaching or loading conductive balls serving as connecting terminals onto a ball grid array (BGA) substrate or board or substrate attached with semiconductor elements or directly onto semiconductor elements.

2. Related Background Art

It is conventionally known that a flip chip type semiconductor device has high level function and high reliability in a high-speed, high-level-function package for use in the field of computers and communication equipment, or in a chip size package (CSP) for use in the field of portable equipment.

In particular, a flip chip BGA type semiconductor device is produced as follows. First, a chip-like semiconductor element is flip-chip-attached to a multilayer interconnection substrate (which will be hereinafter referred to as a "BGA substrate"), which uses an organic material, such as bismaleimide triazine (BT) resin or an epoxy resin, as an insulating plate, via connecting terminals of conductive balls of solder, gold or the like. Moreover, the connecting terminal of the conductive balls is mounted on the BGA substrate, and the BGA substrate is attached onto a mounting substrate via the connecting terminal. Alternatively, there is another semiconductor device wherein connecting terminals of conductive balls are mounted directly on a chip of semiconductor elements, which is flip-chip-attached to a mounting substrate.

In order to load the conductive balls onto the BGA substrate or semiconductor element, a conductive-ball attaching system is used.

Referring to FIGS. 15 through 19, a method for attaching conductive balls onto a BGA substrate or semiconductor element using a conventional conductive-ball attaching system will be described below.

FIG. 15 is a flow chart showing a conductive-ball attaching process using a conductive-ball attaching system. First, after a BGA substrate or semiconductor element is introduced into a conductive-ball attaching system (step 1), conductive balls are vacuum held by a jig called a attaching head having ball vacuum-holding holes in alignment with the electrodes of the BGA substrate (step 2). Then, it is examined by image recognition or the like whether the conductive balls vacuum-held by the attaching head are correctly aligned (step 3). Then, a flux is supplied to any one of the BGA substrate or semiconductor element and the conductive balls vacuum-held by the attaching head (step 4), and the conductive balls are attached onto the electrodes of the BGA substrate or semiconductor element (step 5). Thereafter, it is examined whether the conductive balls remain on the attaching head (step 6), and then, it is examined whether the conductive balls are correctly attached on the BGA substrate or semiconductor element (step 7). Thereafter, the conductive balls are molten and attached to the electrodes of the BGA substrate or semiconductor element by reflow to be fixed to the BGA substrate or semiconductor element (step 8).

FIG. 16 is a sectional view of a conventional ball attaching system. A attaching head 1 for vacuum holding a prescribed number of conductive balls 6 at prescribed positions to load the conductive balls onto a BGA substrate 9 or the like is secured to moving means 2, which is moved by a feed screw (XY) 10 in X and Y directions (horizontal directions), and to moving means 3, which is moved by a feed screw (Z) 11 in Z directions (vertical directions). When the attaching head 1 vacuum holds the conductive balls 6, the attaching head 1 moves above a ball storage vessel 4, in which the conductive balls 6 are stocked. When the vacuum-held conductive balls 6 are moved to the BGA substrate or the like, the attaching head 1 moves above a stage 5. The BGA substrate 9 is secured to the stage 5 by means of a substrate clamper 14.

The vacuum holding of the conductive balls 6 is carried out by evacuating the interior of the attaching head 1 via an air passage (suction side) 12 by air suction means 7 to allow the internal state of the attaching head 1 to be a reduced pressure state to suck the conductive balls 6. In addition, a flux is supplied to the electrodes of the BGA substrate 9 or the like, or to the vacuum-held conductive balls 6 by flux supply means (not shown).

Moreover, when the conductive balls 6 are attached onto the BGA substrate 9 or the like, air is fed into the attaching head 1 via an air passage (exhaust side) 13 by air flow generating means 8 to turn the reduced pressure state into an atmospheric pressure state to detach the conductive balls 6 from the attaching head 1.

FIG. 17 is a sectional view showing the attaching head and the storage vessel when the conductive balls are vacuum held. The internal state of the attaching head 1 is turned to the reduced pressure state by the air suction means 7, so that the conductive balls, which have been turned into flowable balls by means (not shown), are sucked into ball vacuum-holding hole 17 of the attaching head 1. At this time, air passage opening and closing means 15 provided in the air passage 12 extending from the air suction means 7 to the interior of the attaching head 1 is open, and air passage opening and closing means 16 provided in the air passage 13 extending from the air flow generating means 8 to the interior of the attaching head 1 is closed.

FIG. 18 is a sectional view showing the attaching head and the BGA substrate on the stage when the conductive balls are attached onto the electrodes of the BGA substrate or the like. When the conductive balls 6 are attached, the air passage opening and closing means 15 provided in the air passage 12 is closed, and the air passage opening and closing means 16 provided in the air passage 13 is open. Thus, air is fed into the attaching head 1 to turn the internal state of the attaching head 1 into the atmospheric pressure state to detach the conductive balls 6 surrounded by a flux 18 from the ball vacuum-holding holes 17 to load the conductive balls 6 onto the BGA substrate. This BGA substrate is secured to the stage 5 by means of the substrate clamper 14.

Such a conductive-ball attaching process is not carried out every BGA substrate in order to improve productivity. For example, as shown in FIG. 19, conductive balls 6 are usually collectively attached onto a plurality of BGA substrates 9 or semiconductor elements. FIG. 19 is a sectional view showing the attaching head 1 and the BGA substrate 9 on the stage 5 when the conductive balls 6 are attached onto the electrodes of the BGA substrates 9 or the like.

As the form of a substrate, there are an individual piece substrate comprising a set of a plurality of substrates (units) secured to a stage 5 by means of a substrate clamper 14, and a single strip substrate, on which a plurality of semiconductor elements (units) are attached. In either case, a attaching head 1 capable of vacuum holding conductive balls 6, the number of which corresponds to the number of the units, is used. As the substrate having the plurality of semiconductor elements (units), a wafer, from which semiconductor elements have not been cut in the form of chips, is used.

However, as shown in FIGS. 20(a) and 20(b), there are some cases where the strip substrate 19 has defective substrates shown by a defective mark 21. Even in such cases, the conductive balls must be attached onto the defective substrates in the present circumstances, so that the conductive balls are wasted to cause a rise in costs. FIGS. 20(a) and 20(b) are plan and sectional views showing a strip substrate attached with a plurality of semiconductor elements 22, each of which is coated with a sealing material 23 and each of which has a plurality of electrodes 20.

Moreover, in a case where the conductive balls 6 are attached onto a wafer 24 as shown in FIG. 21, if the semiconductor elements 22 are not arranged on the wafer 24 in the form of a square grid, undesired conductive balls 26 are attached on a peripheral portion other than the semiconductor elements. This has a bad influence on the system, and wastes the conductive balls 6. FIG. 21 is a perspective view of a part of the wafer 24 which is divided into the plurality of semiconductor elements 22 by dicing lines 25.

SUMMARY OF THE INVENTION

It is therefore an object of the present invention to eliminate the aforementioned problems and to provide a method for producing a semiconductor device, which is able to load conductive balls onto BGA substrates or semiconductor elements capable of selectively holding the conductive balls so that just enough conductive balls are attached onto the peripheral portion of a wafer, on which the semiconductor elements are irregularly arranged, and so that the conductive balls are not attached onto defective BGA substrates or semiconductor elements, and a semiconductor producing system carrying out the method.

In order to accomplish the aforementioned and other objects, according to the present invention, there is provided a conductive-ball attaching system and method for collectively attaching conductive balls onto a plurality of BGA substrates or semiconductor elements. The conductive-ball attaching system and method use conductive-ball holding means for selectively vacuum holding conductive balls so that just enough conductive balls are attached onto the peripheral portion of a wafer, on which semiconductor elements have been irregularly arranged, and so that conductive balls are not attached onto a defective BGA substrate or semiconductor element.

Thus, according to the present invention, conductive balls are not attached onto undesired places, so that it is possible to prevent conductive balls from being wasted and it is possible to reduce costs.

That is, according to one aspect of the present invention, a method for producing a semiconductor device, comprises the steps of: introducing a plurality of semiconductor element supporting substrates or semiconductor elements into a conductive-ball attaching system for collectively attaching conductive balls onto the supporting substrates or semiconductor elements; detecting a defective substrate or defective semiconductor element of the introduced semiconductor element supporting substrates or semiconductor elements, or an undesired position at which it is not necessary to load the conductive balls; vacuum holding a plurality of conductive balls which are stored in the conductive-ball attaching system by conductive-ball holding means; and selectively attaching the plurality of conductive balls which are vacuum-held by the conductive-ball holding means, onto a desired supporting substrate or semiconductor element of the supporting substrates or semiconductor elements introduced into the conductive-ball attaching system, wherein the conductive-ball holding means selectively vacuum holds the conductive balls so that just enough conductive balls are attached onto the peripheral portion of a wafer on which semiconductor elements are irregularly arranged, and so that the conductive balls are not attached onto the defective supporting substrate or defective semiconductor element.

According to another aspect of the present invention, a semiconductor producing system comprising: a conductive-ball attaching system for collectively attaching conductive balls onto a plurality of objects introduced into the conductive-ball attaching system, the plurality of objects being semiconductor element supporting substrates or semiconductor elements; detector means for detecting an defective object of the plurality of objects, and an undesired region of the plurality of objects, in which it is not necessary to load the conductive balls; and conductive-ball holding means for vacuum holding the plurality of conductive balls stored in said conductive-ball attaching system, the conductive-ball holding means selectively attaching said plurality of conductive balls which are held by said conductive-ball holding means, onto only a desired object of the plurality of objects.

According to another aspect of the present invention, a system for producing a semiconductor device, comprises: a conductive-ball attaching system for collectively attaching conductive balls onto a plurality of semiconductor elements supporting substrates or semiconductor elements; means for detecting a defective substrate or defective semiconductor element of the supporting substrates or semiconductor elements, or an undesired position at which it is not necessary to load the conductive ball; conductive-ball holding means for vacuum holding a plurality of conductive balls stored in the conductive-ball attaching system; and means for selectively attaching the plurality of conductive balls which are held by the conductive-ball holding means, onto a desired supporting substrate or semiconductor element of the supporting substrates or semiconductor elements introduced into the conductive-ball attaching system, wherein the conductive-ball holding means selectively vacuum holds the conductive balls so that just enough conductive balls are attached onto the peripheral portion of a wafer on which semiconductor elements are irregularly arranged, and so that the conductive balls are not attached onto the defective supporting substrate or defective semiconductor element.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

The present invention relates to a method for producing a semiconductor device, which uses a conductive-ball attaching system capable of collectively attaching conductive balls onto a plurality of BGA substrate or semiconductor elements. The conductive-ball attaching system uses conductive-ball holding means for selectively vacuum holding conductive balls so that just enough conductive balls are attached onto the peripheral portion of a wafer, on which the semiconductor elements are irregularly arranged, and so that the conductive balls are not attached onto defective BCA substrates or semiconductor elements.

First, referring to FIG. 11, a semiconductor element for use in the present invention will be described below.

Figure 11:
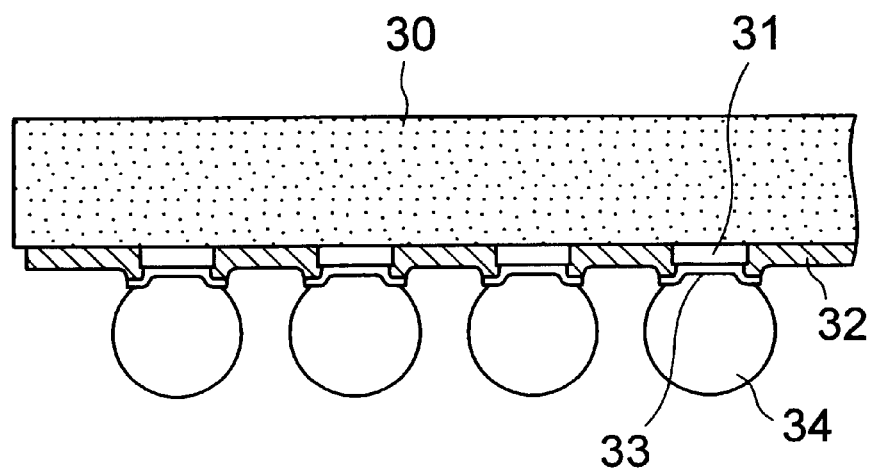
FIG. 11 is a sectional view of a semiconductor element, to which a method for producing a semiconductor device according to the present invention is applied.

FIG. 11 is a sectional view of a semiconductor device. The semiconductor device comprises, e.g., a silicon semiconductor substrate 30. On the principal plane of the semiconductor substrate 30, connection electrodes 31 of aluminum or the like, which are connected to an internal circuit, are formed. Regions of the principal plane of the semiconductor substrate 30, in which the connection electrodes 31 are not formed, are coated with passivation films 32 of oxide films or the like. On the surface of each of the connection electrodes 31, a flux 33 is applied. Each of conductive balls 34 of, e.g., Pb—Sn solder, is formed thereon as a connecting terminal.

Figure 12:
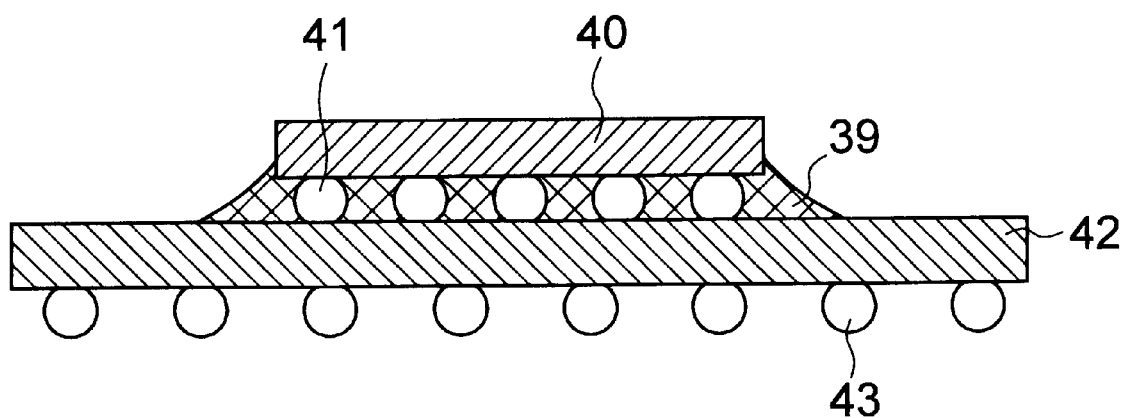
FIG. 12 is a sectional view of a BGA substrate, to which a method for producing a semiconductor device according to the present invention is applied.
Figure 13:
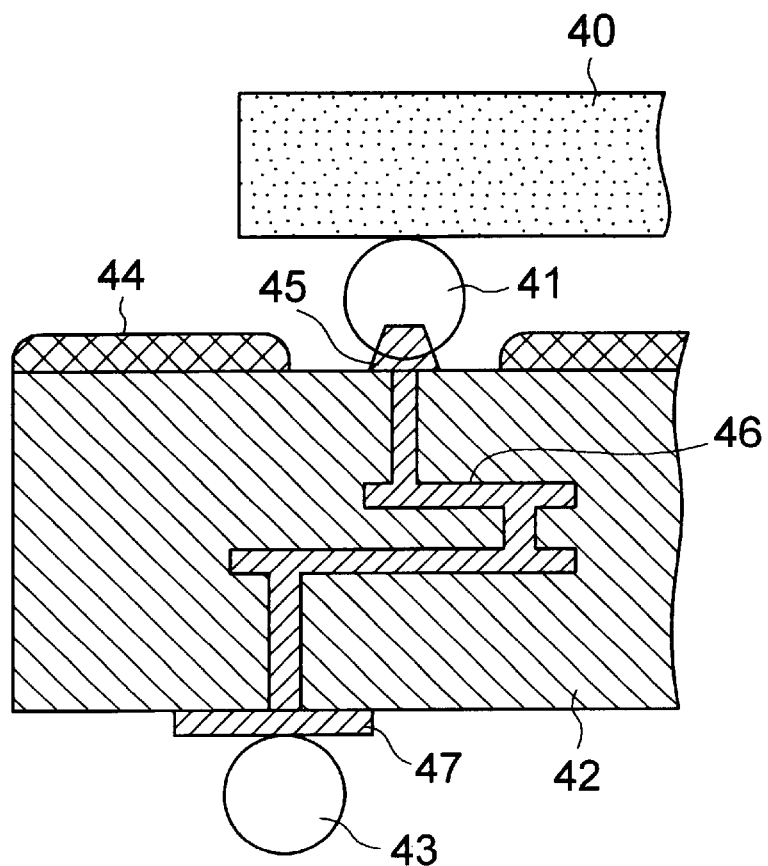
FIG. 13 is an enlarged sectional view of a part of the BGA substrate of FIG. 12.
Figure 14:
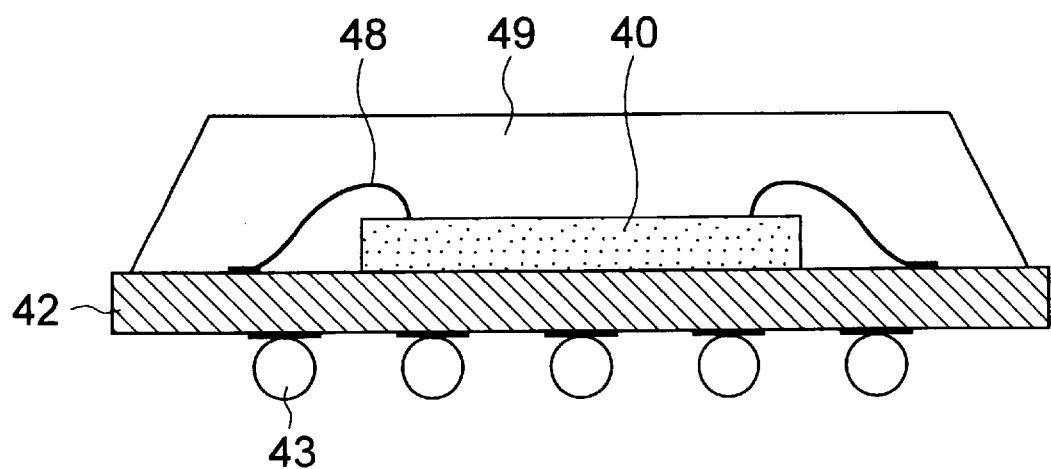
FIG. 14 is a sectional view of a BGA substrate, to which a method for producing a semiconductor device according to the present invention is applied.
Figure 15:
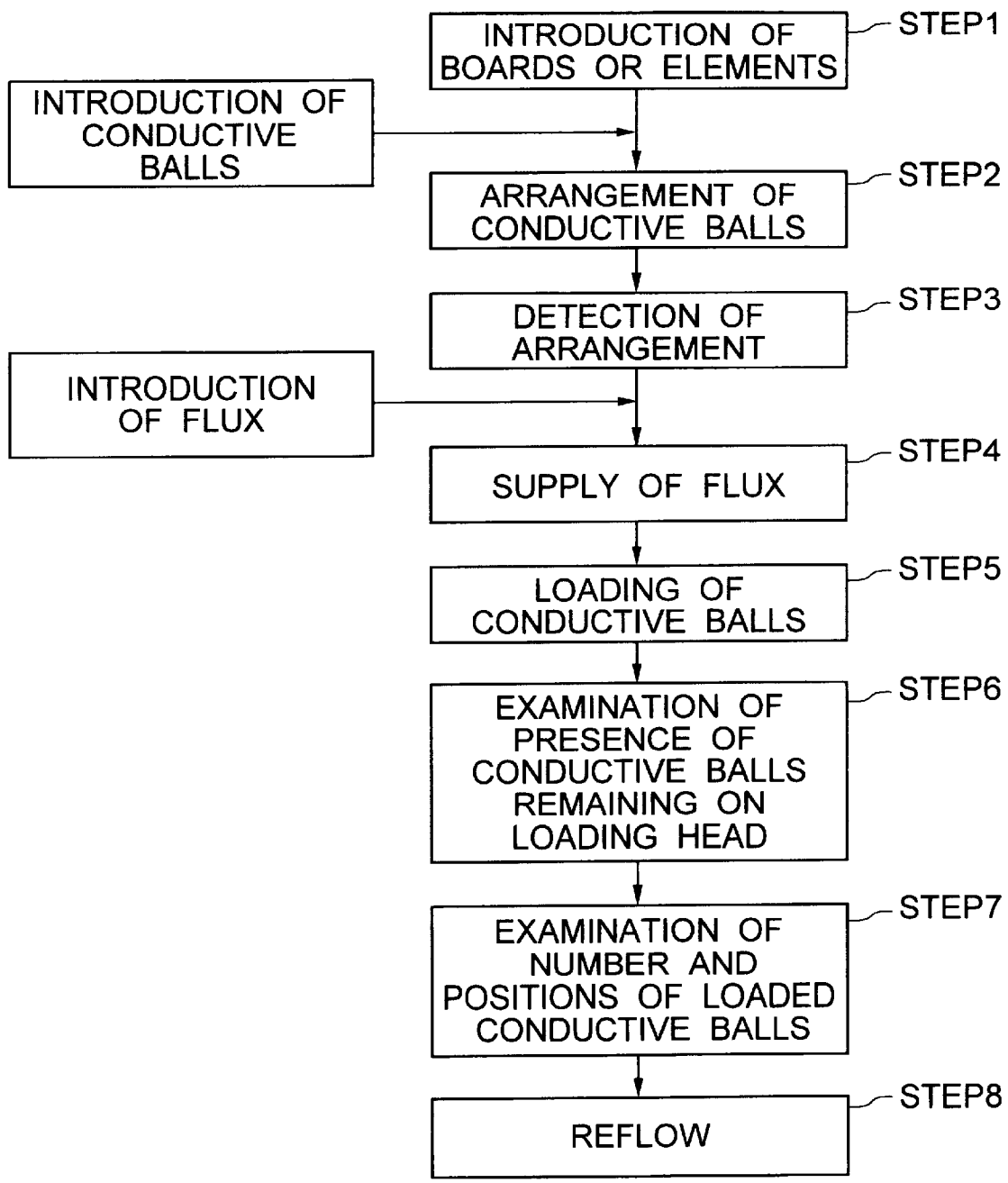
FIG. 15 is a flow chart showing steps of a conventional conductive-ball attaching method.
Figure 16:
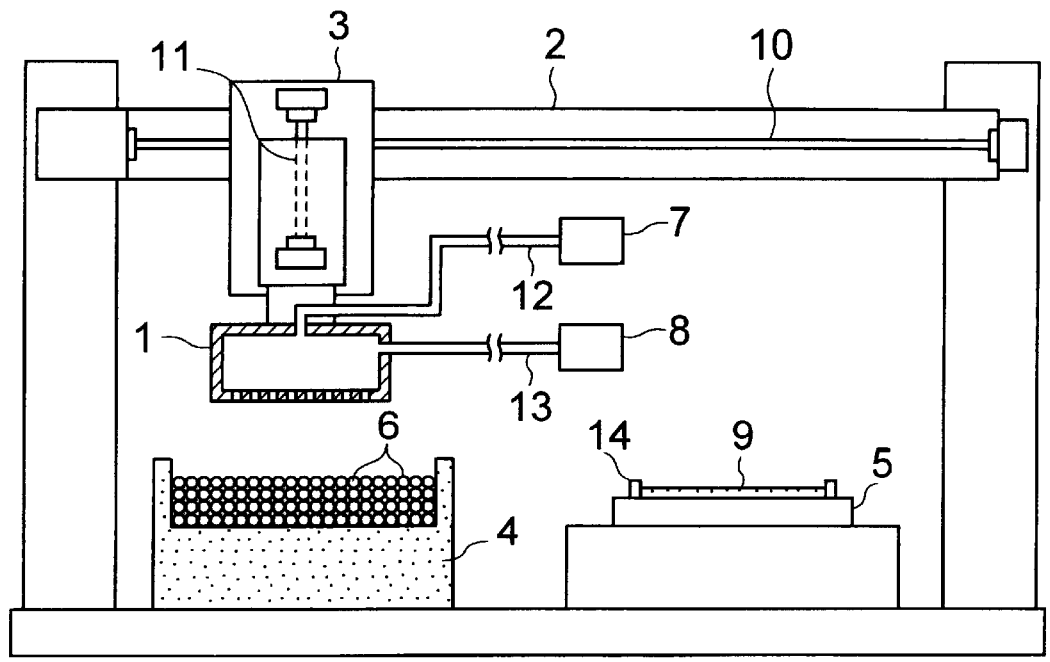
FIG. 16 is a sectional view of a conventional conductive-ball attaching system.
Figure 17:
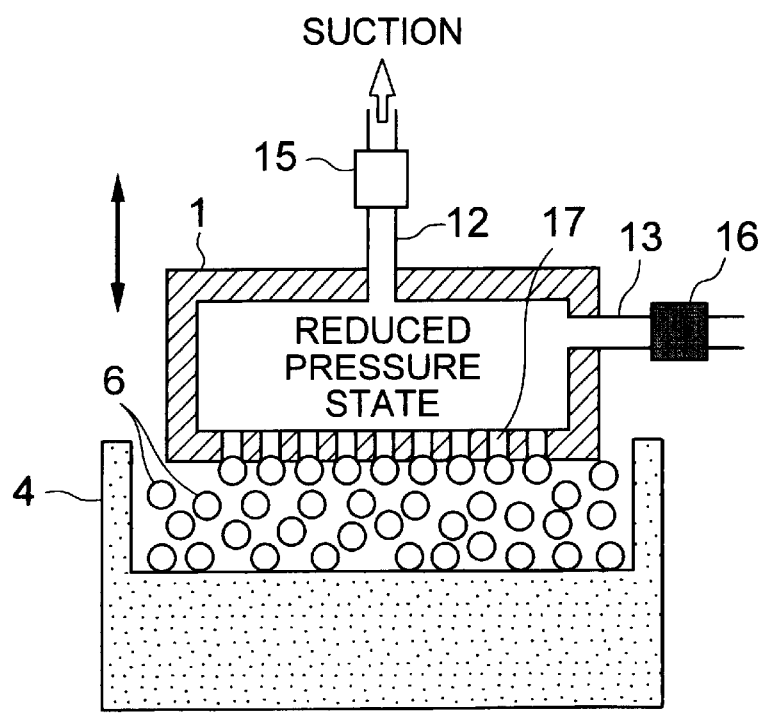
FIG. 17 is a sectional view showing the interior of a conductive-ball attaching system for explaining a conventional conductive-ball vacuum holding method.
Figure 18:
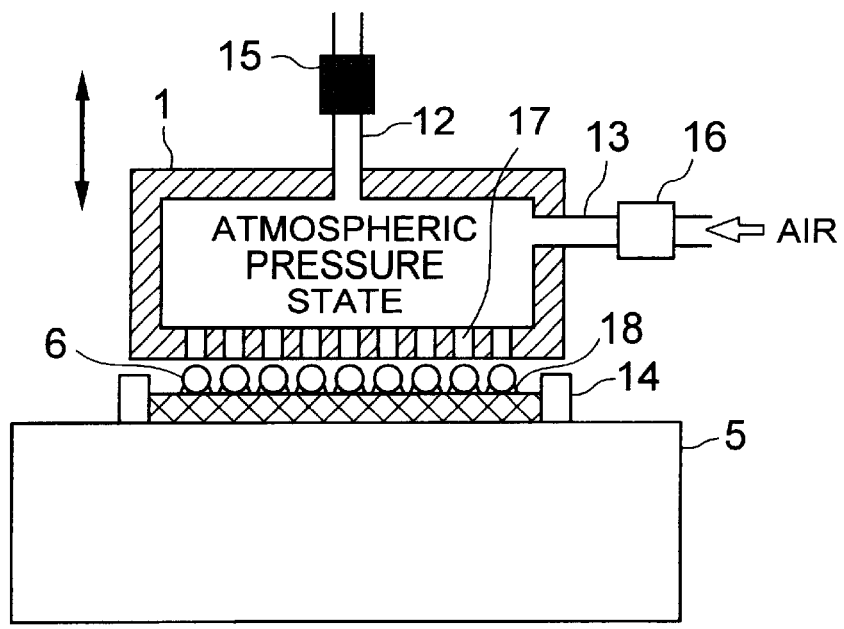
FIG. 18 is a sectional view showing the interior of a conductive-ball attaching system for explaining a conventional conductive-ball vacuum holding method.
Figure 19:
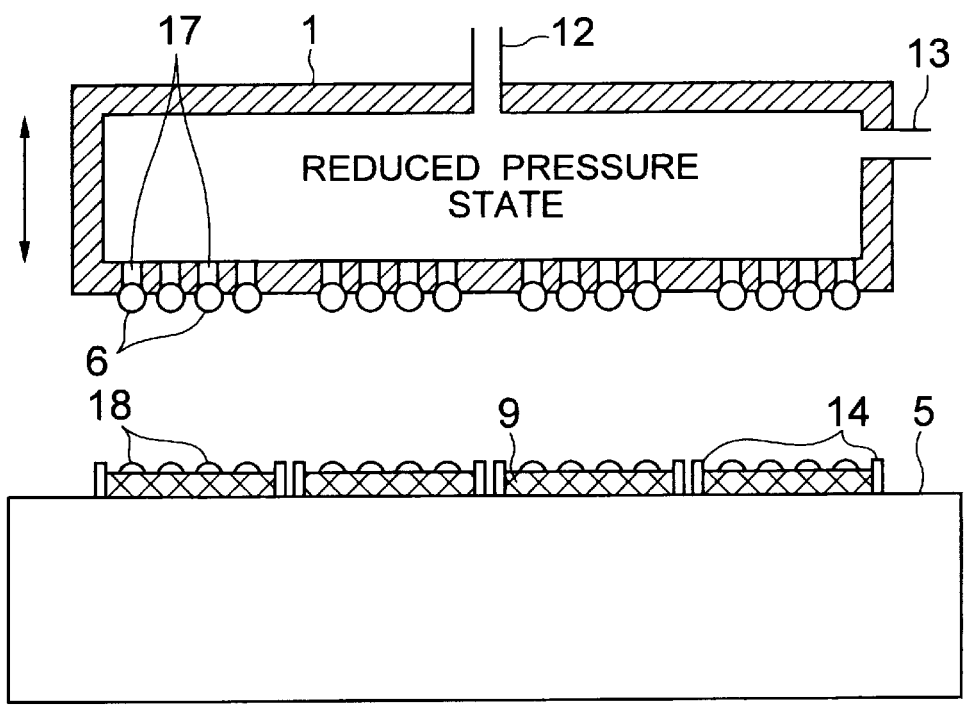
FIG. 19 is a sectional view showing the interior of a conductive-ball attaching system for explaining a conventional method for attaching conductive balls onto a plurality of BGA substrates.
Figure 20:
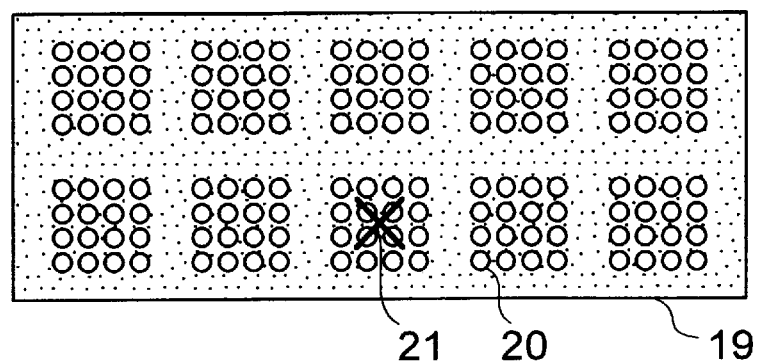
FIGS. 20(a) and 20(b) are plan and sectional views of a BGA strip substrate, on which a plurality of BGA substrates including defective semiconductor elements are arranged.
Figure 20:
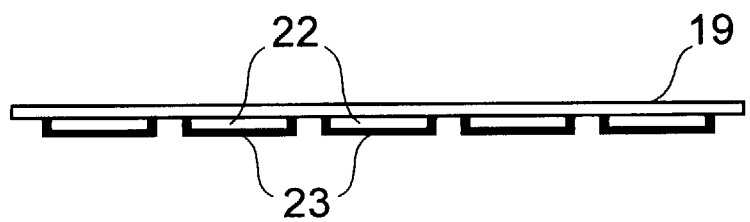
Figure 21:
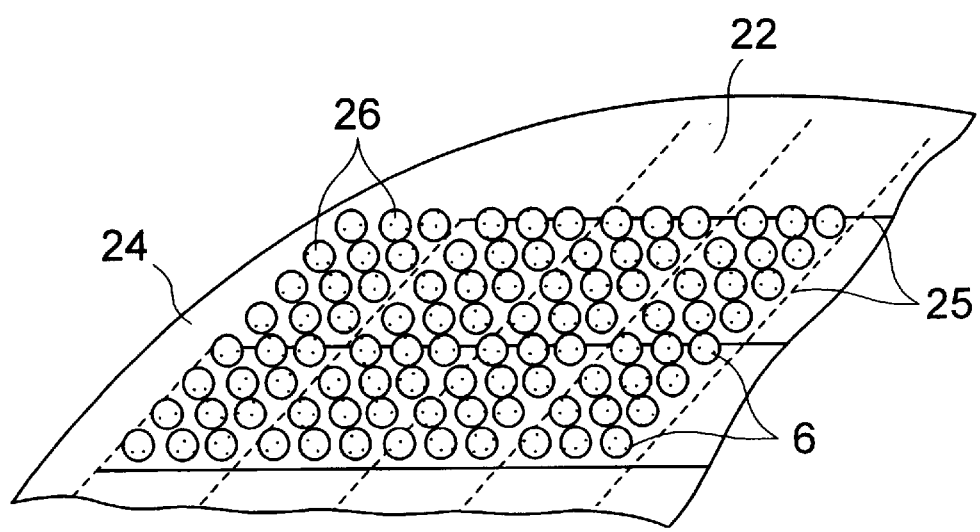
FIG. 21 is a perspective view of a wafer having undesired conductive balls, on which conductive balls to be attached onto a conductive-ball attaching system are attached.

FIGS. 12 through 14 are sectional views of a BGA substrate, on which a semiconductor element is attached. FIG. 13 is an enlarged sectional view of a part of the interior of the BGA substrate. As the BGA substrate, a multilayer interconnection substrate 42, in which multilayer interconnection layers are formed, is used. This semiconductor device has a semiconductor element 40, on which a plurality of conductive balls 41 of solder, gold or the like are mounted as connecting terminals. The semiconductor element 40 is flip-chip-attached to a first plane of the BGA substrate 42 of a multilayer interconnection substrate, which uses an organic material, such as bismaleimide triazine (BT) resin or an epoxy resin, as an insulating plate, via the conductive balls 41. On a second plane of the BGA substrate 42, a plurality of connecting terminals of conductive balls 43 of solder, gold or the like are mounted. A liquid epoxy resin is poured into a space, in which the conductive balls 41 exist, between the BGA substrate 42 and the semiconductor element 40, to be cured to seal the space to form an under-fill resin layer 39.

Referring to FIG. 13, the interior of the multilayer interconnection substrate used as the BGA substrate will be described in detail below. The semiconductor element 40 having the conductive balls 41 is connected to the BGA substrate 42 via the conductive balls 41. Wiring elements 45 are formed on the surface of the BGA substrate 42, and other regions thereof are coated with resist films 44. On the reverse surface of the BGA substrate 42, connection electrodes 47 of copper or the like are formed. Each of the connection electrodes 47 is electrically connected to a corresponding one of the wiring elements 45 via a corresponding one of internal wiring elements 46 of copper or the like formed in the BGA substrate 42. Each of the conductive balls 43 is mounted on a corresponding one of the connection electrodes 47. In addition, each of the conductive balls 41 is connected to a corresponding one of the wiring elements 45 so that a signal outputted from or inputted to an integrated circuit formed on the semiconductor element 40 is outputted from or inputted to an external circuit via the corresponding conductive ball 43.

Referring to FIG. 14, another example of the BGA substrate will be described below. As the BGA substrate, a multilayer interconnection substrate 42, in which multilayer interconnection layers are formed, is used. In this example, the semiconductor device has a semiconductor element 40 having a plurality of connection electrodes. In the semiconductor element 40, a connection electrode (not shown), which is formed on a first plane of the BGC substrate 42 of the multilayer interconnection substrate using an organic material, such as bismaleimide triazine (BT) resin or an epoxy resin, as an insulating plate, is connected to a connection electrode (not shown), which is formed on the principal plane of the semiconductor element 40, by means of a bonding wire 48 to conduct one to another. On the second plane of the BGA substrate, a plurality of connecting terminals of conductive balls 43 of solder, gold or the like are mounted. The semiconductor element 40, the bonding wire 48 and so forth are sealed with a resin sealing material 49 of an epoxy resin or the like.

Figure 1:
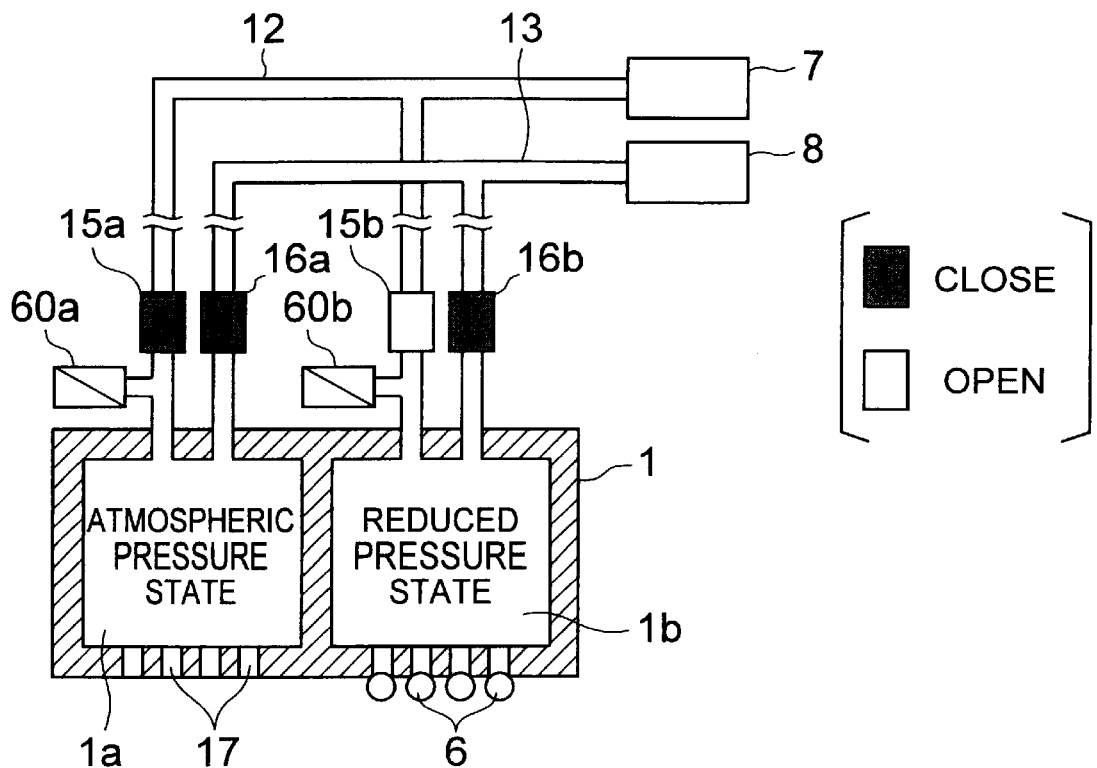
FIG. 1 is a sectional view of the first preferred embodiment of a conductive-ball attaching system according to the present invention.
Figure 2:
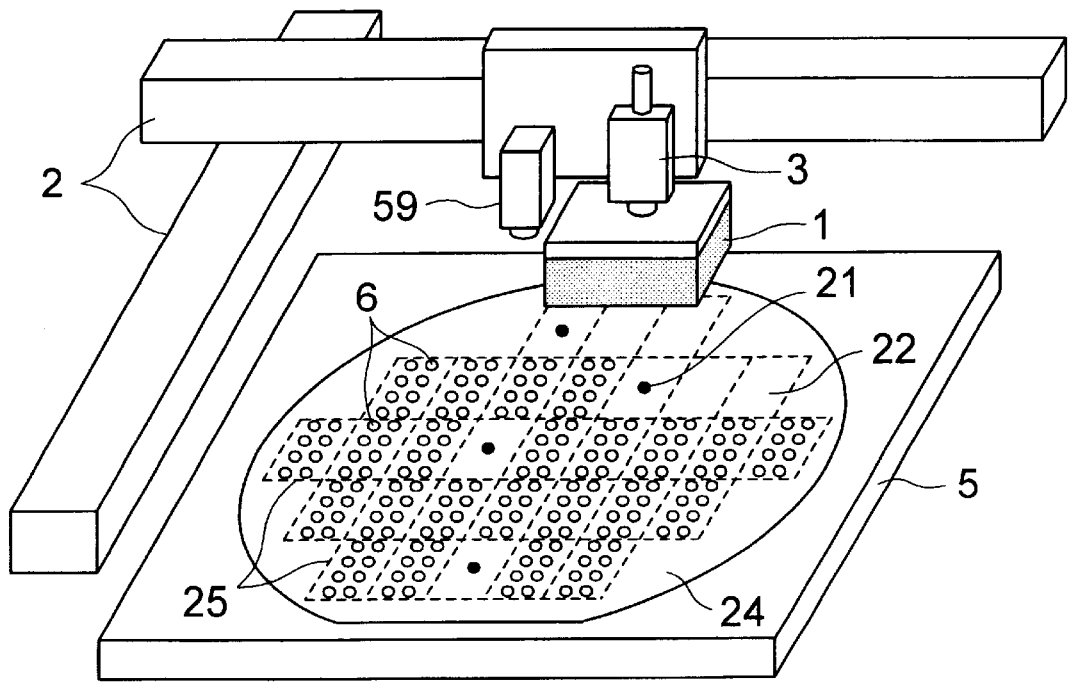
FIG. 2 is a perspective view of a wafer, on which the conductive-ball attaching system of FIG. 1 is arranged.

Referring to FIGS. 1 and 2, the first preferred embodiment of the present invention will be described below.

FIG. 1 is a sectional view of a conductive-ball attaching system. In this conductive-ball attaching system, a attaching head 1 is divided into a plurality of chambers (two chambers 1*a* and 1*b* in this preferred embodiment). A plurality of ball vacuum-holding holes 17 for vacuum holding conductive balls, which are to be mounted on BGA substrates or semiconductor elements, are formed in each of the chambers 1*a* and 1*b*. The interior of the attaching head 1 is separated so that each of the chambers corresponds to a corresponding one of the BGA substrates or semiconductor elements. The conductive-ball attaching system has a single air suction means 7. The air suction means 7 is communicated with each of the chambers via an air passage (suction side) 12, which branches so as to be connected to each of the chambers. In addition, air passage opening and closing means (suction side) 15*a* and 15*b* are provided for each of the chambers. Similarly, the conductive-ball attaching system has single air flow generating means 8. The air flow generating means 8 is communicated with each of the chambers via an air passage (exhaust side) 13, which branches so as to be connected to each of the chambers. In addition, air passage opening and closing means (exhaust side) 16*a* and 16*b* are provided for each of the chambers.

FIG. 1 shows a conductive-ball attaching system for simultaneously attaching conductive balls onto two BGA substrates or semiconductor elements. When the air passage opening and closing means (exhaust side) 16*a* and 16*b* and the air passage opening and closing means (suction side) 15*a* are closed and when the air passage opening and closing means (exhaust side) 15*b* is open, the conductive balls are attached onto only the right BGA substrate or semiconductor element without attaching the balls onto the left BGA substrate or semiconductor element. When the conductive balls are vacuum held and arranged, the suction-side air passage opening and closing means 15*a* for the chamber 1*a*, on which the conductive balls are not attached, is closed so that the chamber 1*a* is not evacuated, and the suction-side air passage opening and closing means 15*b* for the other chamber 1*b*, on which the conductive balls are attached, is open so that the chamber 1*b* is evacuated. At this time, both of the air passage opening and closing means 16*a* and 16*b* on the side of the air flow generating means are closed. In addition, the pressures in the respective chambers are measured by pressure measuring means 60*a* and 60*b*, respectively, and it is confirmed that the internal state of each of the chambers is a predetermined atmospheric open state or reduced pressure state before and after the conductive balls are vacuum held. This is reflected in error stop or vacuum-holding retry operation.

Then, when the conductive balls are attached, the air passage opening and closing means 15*b* is closed, and the air passage opening and closing means 16*b* is open to feed air flow into the chamber 1*b*. The air passage opening and closing means comprises, e.g., an electromagnetic valve, and the control thereof may be automatically or manually carried out. The air suction means, the air flow generating means and the air passages may be provided separately for each of the chambers.

FIG. 2 is a perspective view showing a wafer and a conductive-ball attaching system, which is able to selectively vacuum hold the conductive balls 6 by operating the attaching head 1 on or above the wafer 24. On the wafer 24, a plurality of semiconductor elements 22 divided by dicing lines 25 are formed. Defective marks 21 are put on defective semiconductor elements.

The selection whether the conductive balls are vacuum held is carried out by recognizing the positions of the defective marks 21 or the positions, at which the semiconductor elements are not formed, by detector means 59 before the conductive balls are vacuum held. The detector means 59 is, e.g., an image recognizing system having a CCD camera for picking up an image of a supporting substrate or semiconductor element to detect the presence of a defective mark and an object indicative of the fact that the element is formed, e.g., the presence of the electrode on the element, by an image processing, such as a pattern matching. At this time, if the position of the electrode on the element has been detected, the positioning in XY directions during attaching the conductive balls can be simultaneously carried out, so that the processing capacity can be improved.

The detector means 59 may be a system for recording and processing mapping data, in which information on the positions of and arrangements of defective elements is recorded.

The detection may be carried out every conductive-ball attaching cycle, or the whole detection may be carried out at the same time that the wafer is attached on the stage 5. In addition, each of the semiconductor elements may be detected, or a certain region of the semiconductor elements may be simultaneously detected. Preferably, a larger region is simultaneously detected in order to improve the processing capacity.

As described above, the conductive balls 6 are not attached onto defective semiconductor elements, and the conductive balls 6 are attached onto only non-defective semiconductor elements, as shown in FIG. 2. In addition, the conductive balls 6 are not attached onto portions, on which the semiconductor elements 22 are not formed, and just enough conductive balls 6 can be also attached onto the peripheral portion of the wafer 24.

In this preferred embodiment, the conductive balls are not attached onto undesired places on the wafer, in which the semiconductor elements are not defined, and onto defective semiconductor elements, so that it is possible to prevent the conductive balls from being wasted and it is possible to reduce costs.

Figure 3:
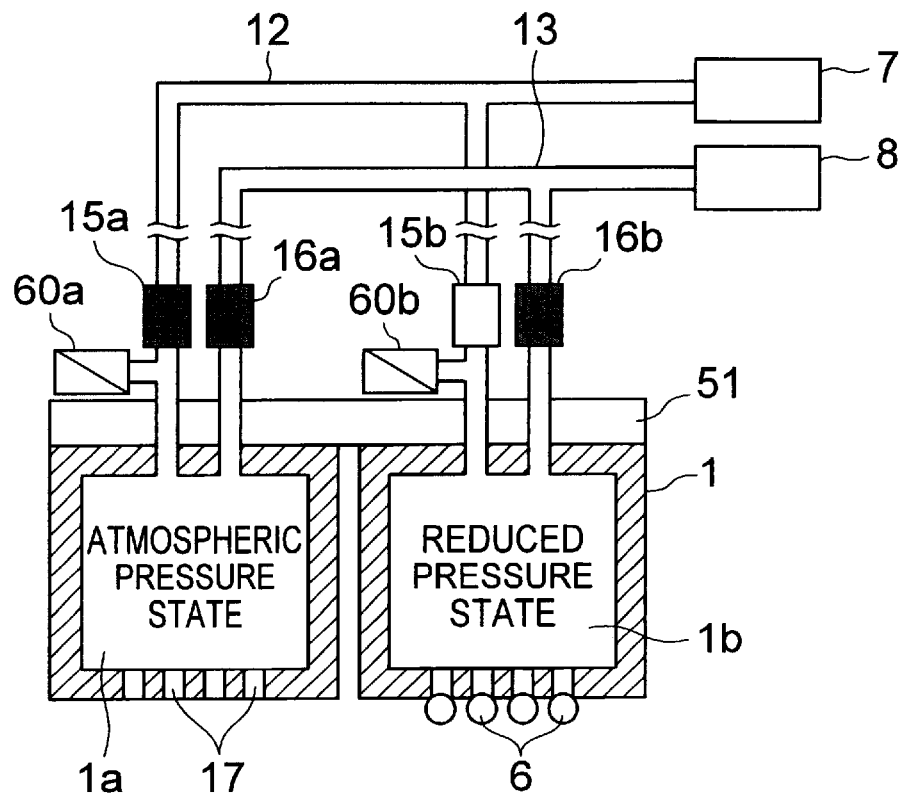
FIG. 3 is a sectional view of the second preferred embodiment of a conductive-ball attaching system according to the present invention.

Referring to FIG. 3, the second preferred embodiment of a conductive-ball attaching system according to the present invention will be described.

In this conductive-ball attaching system, attaching heads are provided separately for a plurality of BGA substrates or semiconductor elements. FIG. 3 is a sectional view of a conductive-ball attaching system. FIG. 3 shows an example of a conductive-ball attaching system having two attaching heads 1 and 1' having ball vacuum-holding holes 17 for vacuum holding conductive balls 6. The attaching heads 1 and 1' are mounted on a fixing jig 51. Similar to the first preferred embodiment, air suction means 7 is connected to the respective attaching heads via separate systems, which are provided with air passage opening and closing means 15a and 15b, respectively. Similarly, air flow generating means 8 is connected to the respective attaching heads via separate systems, which are provided with air passage opening and closing means 16a and 16b and pressure measuring means 60a and 60b, respectively.

When the conductive balls are vacuum held and arranged, the suction-side air passage opening and closing means 15a for the attaching head 1, on which the conductive balls are not attached, is closed so that the attaching head 1 is not evacuated, and the suction-side air passage opening and closing means 15b for the attaching head 1', on which the conductive balls are attached, is open so that the attaching head 1' is evacuated. At this time, both of the air passage opening and closing means 16a and 16b on the side of the air flow generating means are closed. Then, when the conductive balls 6 are attached, the air passage opening and closing means 15b is closed, and the air passage opening and closing means 16b is open to feed air flow into the attaching head 1. The air passage opening and closing means comprises, e.g., an electromagnetic valve, and the control thereof may be automatically or manually carried out. In addition, the air suction means, the air flow generating means and the air passages may be provided separately for each of the attaching heads.

In addition, similar to the first preferred embodiment, the pressures in the respective heads are measured to be reflected in error stop or vacuum-holding retry operation. Similarly, the selection whether the conductive balls are vacuum held is carried out by recognizing the positions of defective marks or the positions, at which the semiconductor elements are not formed, by detector means before the conductive balls are vacuum held.

In this preferred embodiment, the conductive balls are not attached onto undesired places on the wafer, in which the semiconductor elements are not defined, so that it is possible to prevent the conductive balls from being wasted and it is possible to reduce costs.

Figure 4:
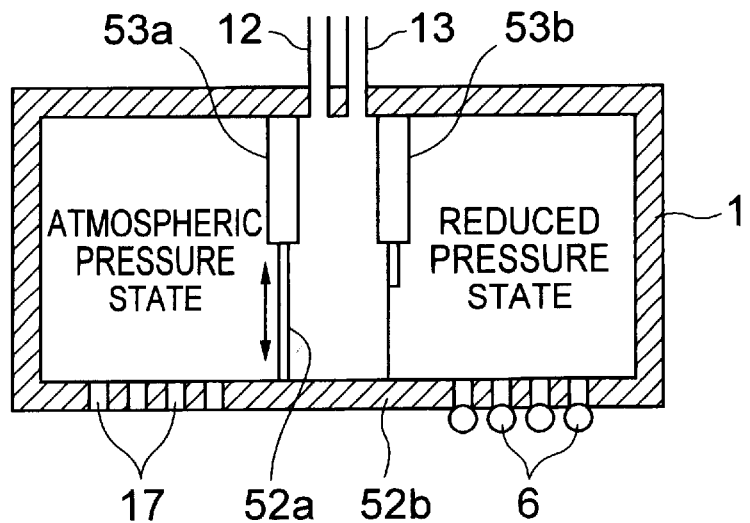
FIG. 4 is a sectional view of the third preferred embodiment of a conductive-ball attaching system according to the present invention.

Referring to FIG. 4, the third preferred embodiment of a conductive-ball attaching system according to the present invention will be described below.

In this preferred embodiment, a conductive-ball attaching system is provided with partition plates 52a and 52b for dividing a attaching head 1 into chambers for each of BGA substrates or semiconductor elements, and means 53a and 53b for opening and closing the partition plates 52a and 52b, respectively. FIG. 4 is a sectional view of the conductive-ball attaching system. In the attaching system shown in FIG. 4, the left partition plate 52a is closed to divide the attaching head 1 into two chambers in order to vacuum hold and load conductive balls onto only the right element. Then, an air passage (suction side) 12 and an air passage (exhaust side) 13 are operated so that the internal state of the left chamber is an atmospheric open state and the internal state of the right chamber is a reduced pressure state. Thus, the conductive balls 6 are vacuum held by only the right chamber. Then, the conductive balls 6 are attached onto the BGA substrate or semiconductor element.

When the portion for vacuum holding and attaching the conductive balls 6 is reversed, the air passages 12 and 13 are operated to close the right partition plate 52b.

In addition, similar to the first preferred embodiment, the pressures in the respective heads are measured to be reflected in error stop or vacuum-holding retry operation. Similarly, the selection whether the conductive balls are vacuum held is carried out by recognizing the positions of defective marks or the positions, at which the semiconductor elements are not formed, by detector means before the conductive balls are vacuum held.

In this preferred embodiment, the conductive balls are not attached onto undesired places on the wafer, in which the semiconductor elements are not defined, so that it is possible to prevent the conductive balls from being wasted and it is possible to reduce costs.

Figure 5:
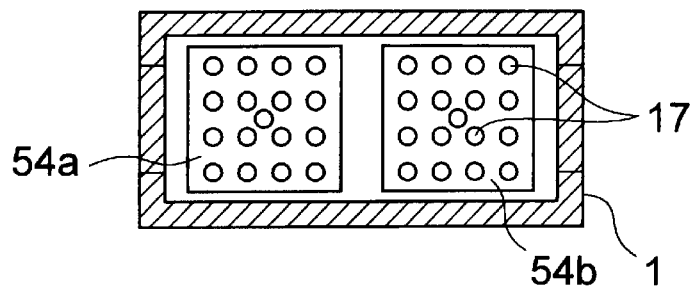
FIGS. 5(a) and 5(b) are sectional views of the conductive-ball attaching system of FIG. 4, which are taken along a horizontal line and a vertical line, respectively.
Figure 5:
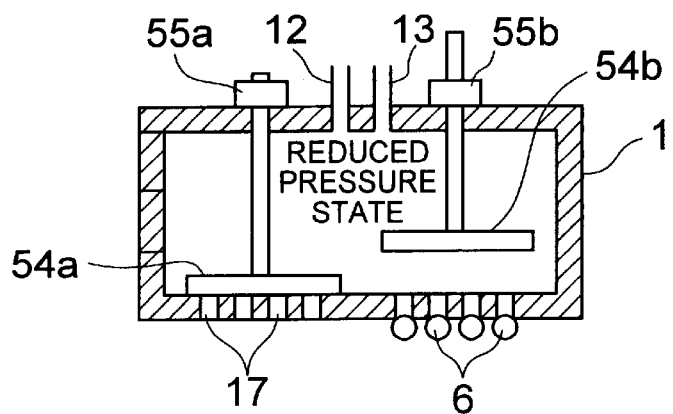

Referring to FIG. 5, the fourth preferred embodiment of a conductive-ball attaching system according to the present invention will be described below.

In this conductive-ball attaching system, shielding plates 54 for shielding ball vacuum-holding holes 17 for each of BGA substrates or semiconductor elements, and shielding-plate moving means 55a and 55b are provided in a attaching head 1.

In FIG. 5, in order to vacuum hold and load conductive balls onto only the right BGA substrate or semiconductor element, the shielding plate moving means 55a is operated to close the left shielding plate 54 to close the ball vacuum-holding holes 17 of one BGA substrate or semiconductor element so that conductive balls 6 are not vacuum held by the left side of the attaching head 1. FIG. 5(a) is a sectional view of a attaching head, and FIG. 5(b) is a sectional view taken along line A–A' of FIG. 5(a).

When the conductive balls 6 are vacuum held, the internal state of the attaching head 1 is a reduced pressure state.

In addition, when the portion for vacuum holding and attaching the conductive balls 6 is reversed (i.e., when the conductive balls 6 are vacuum held by only the left BGA substrate or semiconductor element), the right shielding plate is closed and the left shielding plate is open.

In addition, similar to the first preferred embodiment, the pressures in the respective heads are measured to be reflected in error stop or vacuum-holding retry operation. Similarly, the selection whether the conductive balls are vacuum held is carried out by recognizing the positions of defective marks or the positions, at which the semiconductor elements are not formed, by detector means before the conductive balls are vacuum held.

In this preferred embodiment, the conductive balls are not attached onto undesired places on the wafer, in which the semiconductor elements are not defined, so that it is possible to prevent the conductive balls from being wasted and it is possible to reduce costs.

Figure 6:
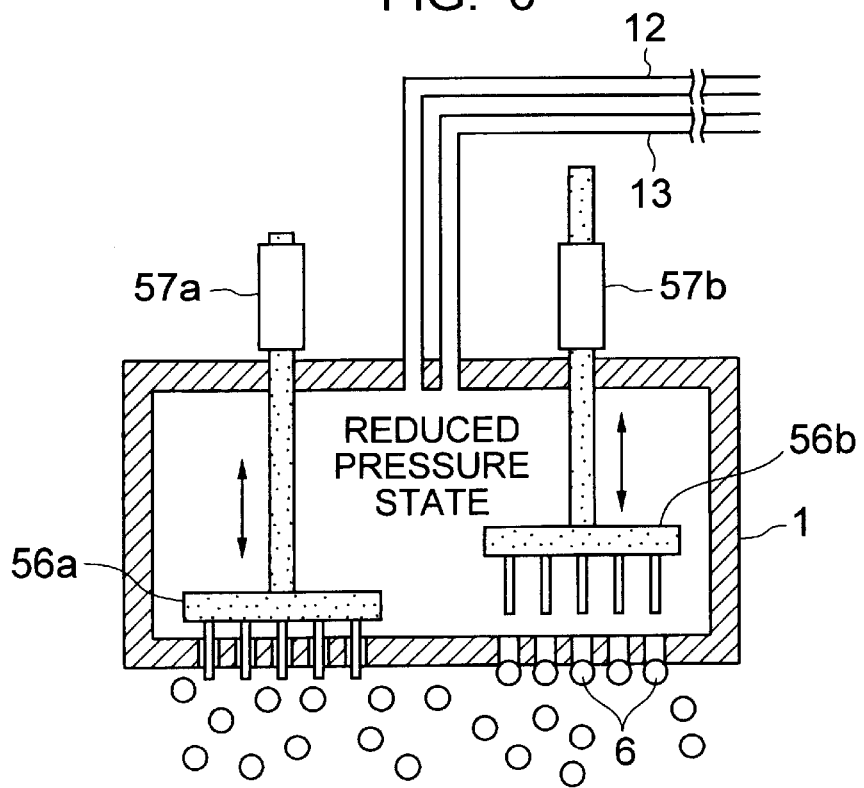
FIG. 6 is a sectional view of the fifth preferred embodiment of a conductive-ball attaching system according to the present invention.

Referring to FIG. 6, the fifth preferred embodiment of a conductive-ball attaching system according to the present invention will be described below.

In this conductive-ball attaching system, a plurality of pinholder-like pins 56a and 56b, each of which has the same arrangement as that of ball vacuum-holding holes 17 for each of BGA substrates or semiconductor elements for closing the ball vacuum-holding holes 17, are provided in a attaching head 1. The holding head 1 is provided with pinholder-like pin moving means 57a and 57b which are movable in vertical directions. The pinholder-like pin moving means 57a and 57b move so that the pinholder-like pins 56a and 56b can move for each of the arrangements of the ball vacuum-holding holes 17. FIG. 6 is a sectional view of the conductive-ball attaching system.

In FIG. 6, in order to vacuum hold and load conductive balls onto only the right BGA substrate or semiconductor element in the attaching head 1, the left pin moving means 57a is operated to move the pinholder-like pins 56a downwards to insert the pinholder-like pins 56a into the ball vacuum-holding holes 17 so that the conductive balls 6 can not be vacuum held. The internal state of the attaching head 1 is provided by operating air passages 12 and 13. In this case, the diameter of each of the pinholder-like pins 56a and 56 must be smaller than the diameter of each of the ball vacuum-holding holes 17. In addition, the length of each of the pinholder-like pins 56a and 56b may slightly project from the attaching head 1.

When the conductive balls 6 are vacuum held and attached onto only the left BCA substrate or semiconductor element, the left pinholder-like pins 56a are arranged in the attaching head 1, and the right pinholder-like pins 56b are inserted into the ball vacuum-holding holes 17.

In addition, the pinholder-like pin moving means may be arranged in the attaching head 1.

In this preferred embodiment, the conductive balls are not attached onto undesired places on the wafer, in which the semiconductor elements are not defined, so that it is possible to prevent the conductive balls from being wasted and it is possible to reduce costs.

Figure 7:
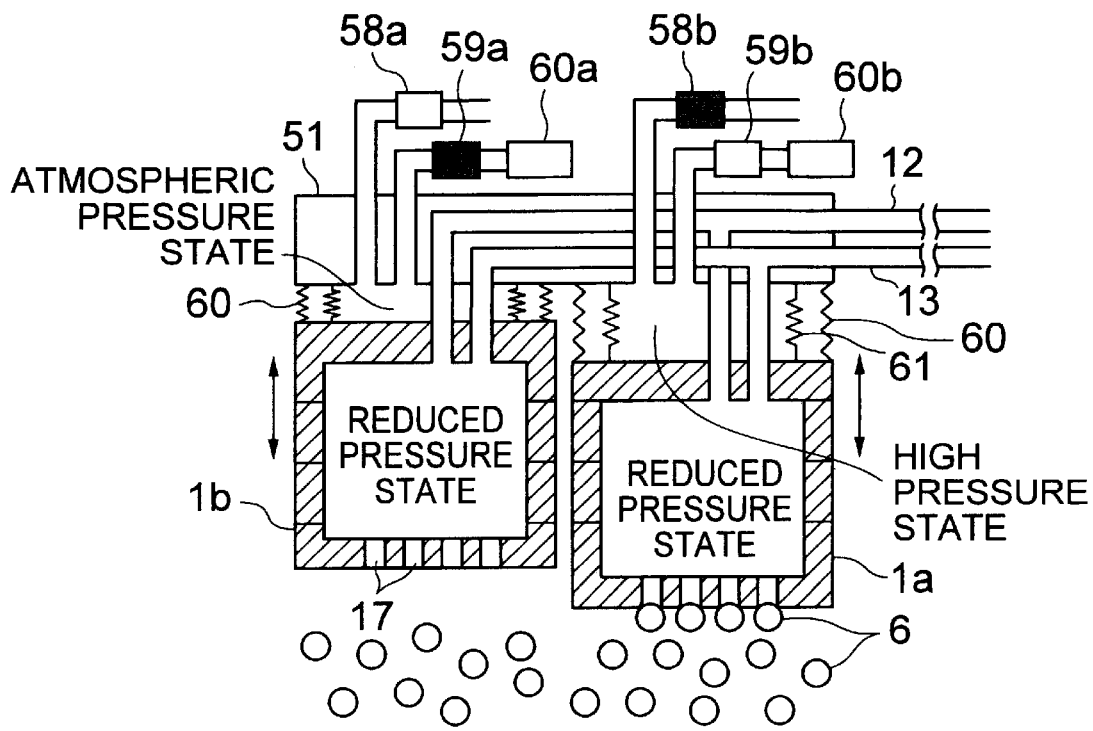
FIG. 7 is a sectional view of the sixth preferred embodiment of a conductive-ball attaching system according to the present invention.

Referring to FIG. 7, the sixth preferred embodiment of a conductive-ball attaching system according to the present invention will be described below.

This conductive-ball attaching system has a plurality of attaching heads (two attaching heads 1a and 1b in this preferred embodiment) suspended from a fixing jig 51. Each of the attaching heads 1a and 1b is arranged so as to correspond to conductive balls 6 for each of BGA substrates or semiconductor elements. In addition, in order to separately change the heights of the bottom surfaces of the attaching heads 1a and 1b (i.e., the surfaces of the attaching heads 1a and 1b for vacuum holding the conductive balls 6) with respect to the conductive balls 6, head moving units are provided for vertically moving the attaching heads 1a and 1b, respectively. FIG. 7 is a sectional view of the conductive-ball attaching system.

As can be seen from FIG. 7, the vertical movements of the attaching heads 1a and 1b are adjusted as follows. That is, each of the attaching heads 1a and 1b is suspended from the fixing jig 51 by means of a diaphragm 60 and a spring 61. When high-pressure air is introduced from air generating means 60a or 60b into the diaphragm 60, the corresponding attaching head 1a or 1b moves downwards against the biasing force of the spring 61 as shown by the right head 1a. When the high-pressure air is exhausted from the diaphragm 60, the corresponding attaching head 1a or 1b moves upwards as shown by the left head 1b. In FIG. 7, reference numbers 58a, 58b, 59a and 59b denote air passage opening and closing means.

Figure 7A:
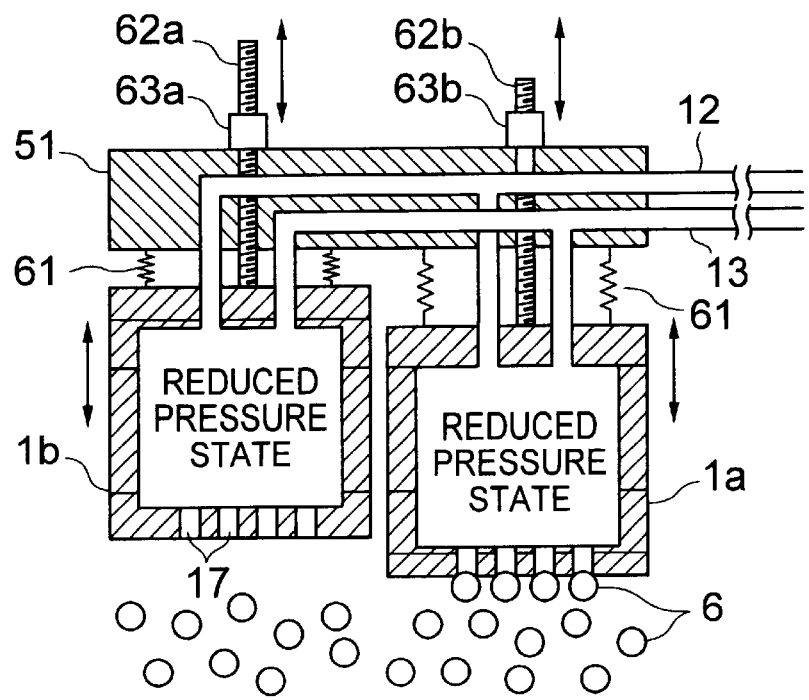
FIG. 7A is a sectional view of a modified example of the sixth preferred embodiment.

FIG. 7A shows a modified example of the preferred embodiment shown in FIG. 7. In this example, a screwed rod is used as means for vertically moving each of attaching heads 1a and 1b. That is, push rods (screwed rods) 62a and 62b, which are secured to attaching heads 1a and 1b, respectively, pass through a fixing jig 51, and the exposed head portions of the push rods 62a and 62b are engaged with nut-like push-rod moving means 63a and 63b, respectively. By rotating the push-rod moving means 63a, 63b, the attaching heads 1a, 1b move vertically.

In FIGS. 7 and 7A, in order to vacuum hold and load conductive balls 6 onto only the BGA substrate or semiconductor element facing the right attaching head 1a, the left attaching head 1b is arranged at a higher level than the vacuum holding position so as not to be able to vacuum hold the conductive balls 6 when the conductive balls 6 are vacuum held by the right attaching head 1a. The internal states of the attaching heads 1a and 1b are changed by operating the air passages 12 and 13. When the conductive balls 6 are vacuum held and attached onto only the BGA substrate or semiconductor element facing the left attaching head 1b, the right attaching head 1a is moved upwards.

In addition, similar to the first preferred embodiment, the pressures in the respective heads are measured to be reflected in error stop or vacuum-holding retry operation. Similarly, the selection whether the conductive balls are vacuum held is carried out by recognizing the positions of defective marks or the positions, at which the semiconductor elements are not formed, by detector means before the conductive balls are vacuum held.

In this preferred embodiment, the conductive balls are not attached onto undesired places on the wafer, in which the semiconductor elements are not defined, so that it is possible to prevent the conductive balls from being wasted and it is possible to reduce costs.

Figure 8:
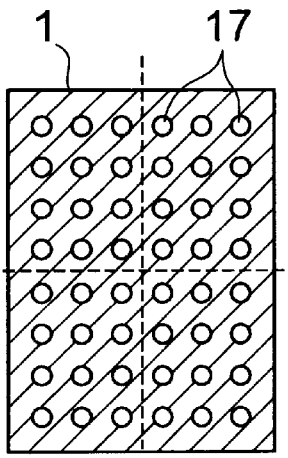
FIGS. 8(a) through 8(c) are plan views showing a vacuum holding plane of the seventh preferred embodiment of a attaching head according to the present invention.
Figure 8:
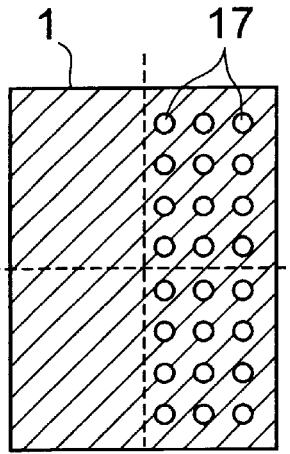
Figure 8:
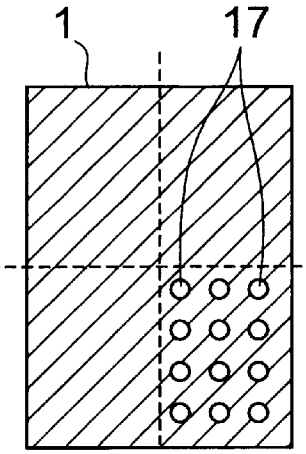
Figure 9:
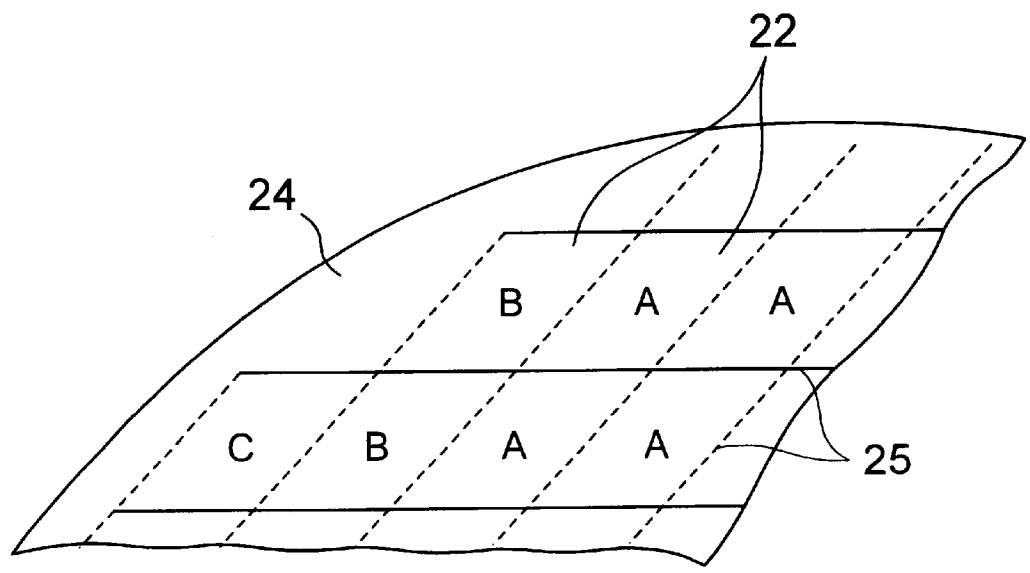
FIG. 9 is a perspective view of a wafer for use in the seventh preferred embodiment.

Referring to FIGS. 8 and 9, the seventh preferred embodiment of the present invention will be described below.

FIGS. 8(a) through 8(c) are plan views of a attaching head of a conductive-ball attaching system, which show the arrangement of ball vacuum-holding holes, and FIG. 9 is a perspective view of a part of a wafer. In this preferred embodiment, various attaching heads can be mounted on the conductive-ball attaching system, and a mechanism for switching the attaching head to be used is provided. As the attaching heads 1, there are a attaching head wherein conductive balls 6 are arranged on the whole vacuum-holding surface thereof (FIG. 8(a)), a attaching head wherein conductive balls 6 are arranged on a half of the vacuum-holding surface thereof (FIG. 8(b)), and a attaching head wherein conductive balls 6 are arranged on a quarter of the vacuum-holding surface thereof (FIG. 8(c)).

For example, when conductive balls 6 for a plurality of semiconductor elements 22 are collectively attached onto a wafer 24, which is divided into the semiconductor elements 22 by dicing lines 25, as shown in FIG. 9, three patterns of arrangements of ball vacuum-holding holes are prepared as shown in FIG. 8, and the attaching heads are selectively used so as to correspond to the attaching place on the wafer 24, so that it is possible to prevent the conductive balls from being attached onto excessive places.

The attaching head of type A shown in FIG. 8(a) is used for semiconductor elements 22, on which marks A are put in FIG. 9. The attaching head of type B shown in FIG. 8(b) is used for semiconductor elements 22, on which marks B are put. The attaching head of type C shown in FIG. 8(c) is used for semiconductor elements 22, on which marks C are put. Means for switching the attaching head may be any means.

In addition, similar to the first preferred embodiment, the pressures in the respective heads are measured to be reflected in error stop or vacuum-holding retry operation. Similarly, the selection whether the conductive balls are vacuum held is carried out by recognizing the positions of defective marks or the positions, at which the semiconductor elements are not formed, by detector means before the conductive balls are vacuum held.

In this preferred embodiment, the conductive balls are not attached onto undesired places on the wafer, in which the semiconductor elements are not defined, so that it is possible to prevent the conductive balls from being wasted and it is possible to reduce costs.

Figure 10:
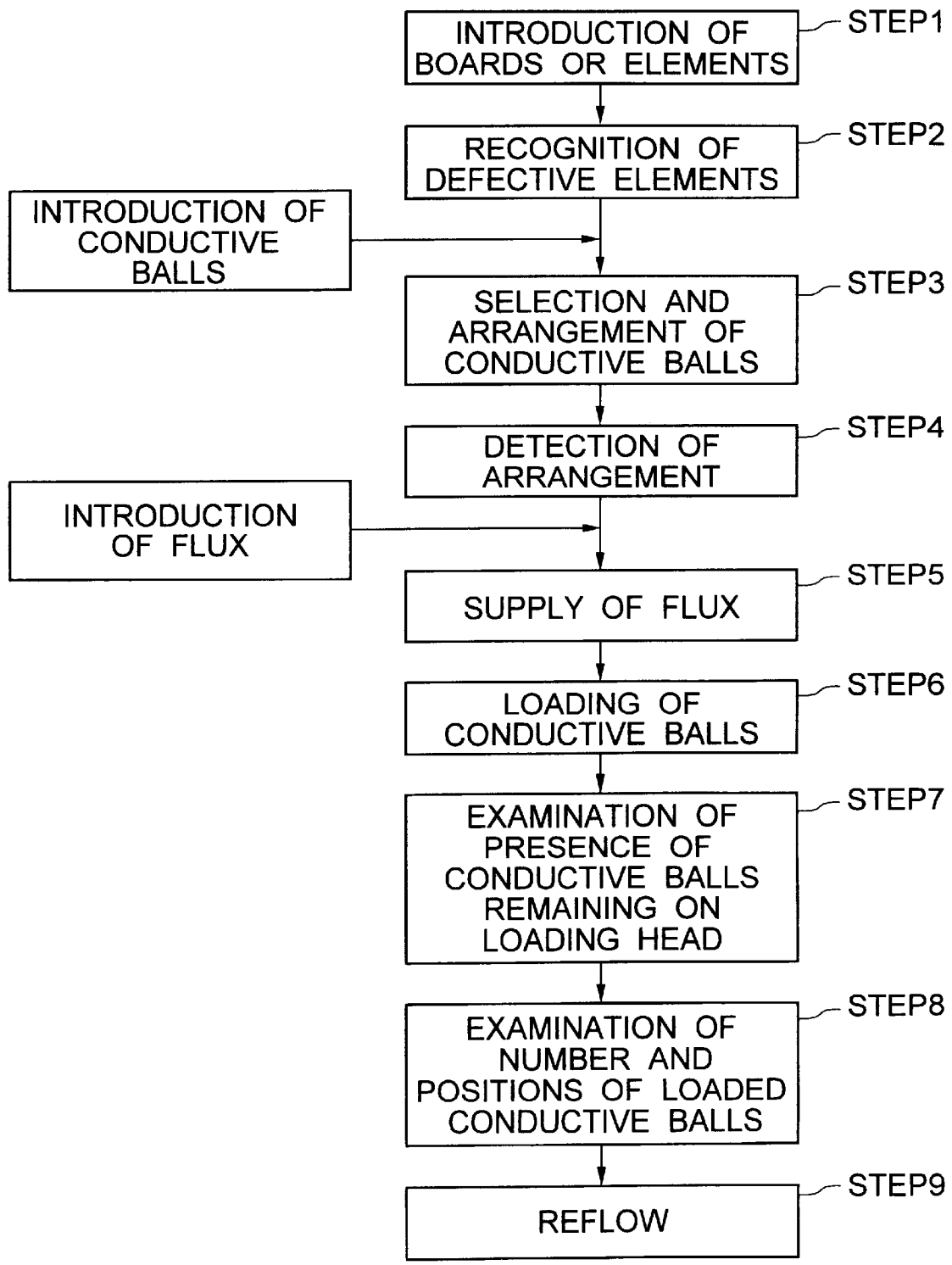
FIG. 10 is a flow chart showing steps of a conductive-ball attaching method according to the present invention.

Referring to FIG. 10, a method for attaching conductive balls onto a BGA substrate or semiconductor element using any one of the above described preferred embodiments of a conductive-ball attaching system according to the present invention will be described below. FIG. 10 is a flow chart showing conductive-ball attaching steps in a conductive-ball attaching system.

First, after BGA substrates or semiconductor elements are introduced into the conductive-ball attaching system (introduction of substrates or elements) (step 1), the position of a defective BGA substrate or defective semiconductor element and the position, at which it is not necessary to load conductive balls, are detected from the introduced BGA substrates or semiconductor elements introduced into the conductive-ball attaching system (detection of position of defective substrate or defective element and position, at which it is not necessary to load conductive balls) (step 2). Then, just enough conductive balls are vacuum held by a jig called a attaching head which has ball vacuum-holding holes arranged so as to correspond to the electrodes of the BGA substrates (selective arrangement of conductive balls) (step 3). Then, it is examined by image recognition or the like whether the conductive balls vacuum-held by the attaching head are correctly arranged (examination of arrangement) (step 4). Then, a flux is supplied to the BGA substrates or semiconductor elements or to the conductive balls vacuum-held by the attaching head (supply of flux) (step 5), and the conductive balls are attached onto the electrodes of the BGA substrates or semiconductor elements (attaching of conductive balls) (step 6). Thereafter, it is examined whether the conductive balls remain on the attaching head (examination of remaining conductive balls) (step 7), and it is examined whether the conductive balls are correctly attached on the BGA substrates or semiconductor elements (examination of attaching) (step 8). Thereafter, the conductive balls are molten and attached to the electrodes of the BGA substrates or semiconductor elements by reflow to be fixed to the BGA substrates or semiconductor elements (reflow) (step 9).

As described above, according to the conductive-ball attaching method of the present invention and the conductive-ball attaching system carrying out the same, the conductive balls are not attached onto undesired places, so that it is possible to prevent the conductive balls from being wasted and it is possible to reduce costs.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a semiconductor device, which comprises the steps of:
   carrying a plurality of objects, these objects being semiconductor element supporting substrates or semiconductor elements, into a conductive-ball attaching system for collectively attaching conductive balls onto said object;
   detecting a defective object of the introduced objects, or an undesired position of said object, on which it is not necessary to load said conductive balls;
   vacuum holding a plurality of conductive balls which are stored in said conductive-ball attaching system by conductive-ball holding means; and
   selectively attaching said plurality of conductive balls, which are vacuum-held by said conductive-ball holding means, onto a desired object of said objects carried into said conductive-ball attaching system,
   wherein said conductive-ball holding means selectively vacuum holds said conductive balls so that said conductive balls are not attached onto said defective object of said undesired position thereof.

2. A method for producing a semiconductor device as set forth in claim 1, wherein said conductive-ball holding means comprises an attaching head which comprises a plurality of chambers, and air passages connected between each of said chambers and said chamber evacuating means, each of said air passages being provided for a corresponding one of said chambers, and each of said air passages being selectively open and closed, based on information regarding the defective object and undesired position of the object, to reduce the pressure in said chambers to vacuum hold said conductive balls.

3. A method for producing a semiconductor device as set forth in claim 1, wherein said conductive-ball holding means comprises a plurality of attaching heads, attaching-head evacuating means for evacuating said attaching heads, and air passages between each of said attaching heads and said attaching-head evacuating means, each of said air passages being provided for a corresponding one of said attaching heads, and each of said air passages being opened and closed, based on information regarding the defective object and undesired position of the object, to reduce the pressure in a predetermined one of said attaching heads to vacuum hold said conductive balls.

4. A method for producing a semiconductor device as set forth in claim 1, wherein said conductive-ball holding means comprises an attaching head which has a plurality of partition plates for dividing the interior of said attaching head into a plurality of chambers, and partition-plate moving means for moving said plurality of partition plates, and each of said plurality of partition plates being opened and closed, based on information regarding the defective object and undesired position of the object, to reduce the pressure in each of said plurality of chambers to vacuum-hold said conductive balls.

5. A method for producing a semiconductor device as set forth in claim 1, wherein said conductive-ball holding means comprises an attaching head which has therein a plurality of shielding plates each for masking a corresponding vacuum-holding hole for vacuum-holding said conductive balls by the remaining unmasked vacuum-holding holes, and shielding-plate moving means for moving said plurality of shielding plates based on information regarding the defective object and undesired position of the object, to close desired vacuum holding holes not to vacuum-hold said conductive balls.

6. A method for producing a semiconductor device as set forth in claim 1, wherein said conductive-ball holding means comprises an attaching head which has therein a plurality of pin-groups of pins, each pin-group closing based on information regarding the defective object and undesired position of the object corresponding to each hole-group of said vacuum-holding holes so that an opened hole-group may vacuum-hold said conductive balls, and pin-group moving means for moving selected said pin-group to open and close each corresponding hole-group.

7. A method for producing a semiconductor device as set forth in claim 3, wherein said conductive-ball holding means comprises a plurality of attaching heads which can move up and down independently, each said attaching head having a bottom plate with vacuum-holding holes for vacuum-holding said conductive balls, and the level of each of said bottom plate of each attaching head is selectively downward shifted to vacuum hold said conductive balls.

8. A method for producing a semiconductor device as set forth in claim 1, wherein said conductive-ball holding means comprises a plurality of attaching heads, each said attaching head having a bottom plate with vacuum-holding holes for vacuum-holding said conductive balls, and the arrangement patterns of the vacuum-holding holes of the attaching heads are different from each other, and said attaching heads to be used are optionally selected, based on information regarding the defective object and undesired position of the object, to formulate an arrangement pattern of vacuum-holding holes to vacuum-hold said conductive balls.

9. A method for producing a semiconductor device as set forth in claim 1, wherein said detector means determines whether it is necessary to load said conductive balls onto each of said plurality of objects, by processing an image picked up by an image pickup camera of said detector means.

10. A method for producing a semiconductor device as set forth in claim 1, wherein said detector means determines whether it is necessary to load said conductive balls onto each of said plurality of objects, on the basis of mapping data including information on the position and arrangement of defective object.

11. A method for producing a semiconductor device as set forth in claim 1, wherein the internal state of each of a plurality of divided chambers in a attaching head of said conductive-ball holding means is independently switched between an atmospheric pressure state and a reduced pressure state, the pressure of said reduced pressure state being lower than that of said atmospheric pressure state, so that said conductive balls are vacuum-held by one or more chambers whose internal states are said reduced pressure state.

12. A method for producing a semiconductor device as set forth in claim 1, wherein said conductive-ball holding means has a plurality of attaching heads independent of each other, the internal state of each of said plurality of attaching heads being switched independently of other attaching heads of said plurality of attaching heads between an atmospheric pressure state and a reduced pressure state, the pressure of said reduced pressure state being lower than that of said atmospheric pressure state, so that said conductive balls are vacuum-held by one or more of said plurality of heads whose internal state is said reduced pressure state.

13. A method for producing a semiconductor device as set forth in claim 1, wherein the internal state of a pressure regulating chamber of said conductive-ball holding means is switched between an atmospheric pressure state and a reduced pressure state, the pressure of said reduced pressure state being lower than that of said atmospheric pressure state, so that said pressure regulating chamber can be independently connected with any one or more chambers.

14. A method for producing a semiconductor device as set forth in claim 1, wherein the internal state of a chamber of a attaching head of said conductive-ball holding means is switched between an atmospheric pressure state and a reduced pressure state, the pressure of said reduced pressure state being lower than that of said atmospheric pressure state, so that said conductive balls are vacuum-held by said chamber when said internal state is said reduced pressure state, and any one or more groups of holes are switched between an open state and a closed state independently of other groups of holes.

15. A method for producing a semiconductor device as set forth in claim 1, wherein a plurality of detachable attaching heads of said conductive-ball holding means are used so as to correspond to an arrangement pattern of a desired object.

\* \* \* \* \*